US011835602B1

(12) United States Patent
Du et al.

(10) Patent No.: US 11,835,602 B1
(45) Date of Patent: Dec. 5, 2023

(54) MAGNETIC PARTICLE IMAGING (MPI) RECONSTRUCTION METHOD BASED ON RECNET MODEL

(71) Applicant: INSTITUTE OF AUTOMATION, CHINESE ACADEMY OF SCIENCES, Beijing (CN)

(72) Inventors: Yang Du, Beijing (CN); Jie Tian, Beijing (CN); Zhengyao Peng, Beijing (CN); Lin Yin, Beijing (CN); Qian Liang, Beijing (CN)

(73) Assignee: INSTITUTE OF AUTOMATION, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 18/144,256

(22) Filed: May 8, 2023

(30) Foreign Application Priority Data

Jun. 22, 2022 (CN) .......................... 202210712519.7

(51) Int. Cl.
  *G06K 9/64* (2006.01)
  *G01R 33/12* (2006.01)
  *G06T 11/00* (2006.01)
  *G06N 3/091* (2023.01)
(52) U.S. Cl.
  CPC ......... *G01R 33/1276* (2013.01); *G06N 3/091* (2023.01); *G06T 11/003* (2013.01)
(58) Field of Classification Search
  CPC .... G01R 33/1276; G06N 3/091; G06T 11/003
  See application file for complete search history.

(56) References Cited

FOREIGN PATENT DOCUMENTS

| CN | 110420026 A | * | 11/2019 |
|---|---|---|---|
| CN | 110619264 A | | 12/2019 |
| CN | 113129403 A | | 7/2021 |
| CN | 113331812 A | * | 9/2021 |
| CN | 113331812 A | | 9/2021 |
| CN | 113628296 A | * | 11/2021 |
| CN | 113628296 A | | 11/2021 |
| CN | 113781365 A | | 12/2021 |

(Continued)

OTHER PUBLICATIONS

Chen Xiaojun, et al., Research progress on reconstruction for magnetic particle imaging based on system matrix, Beijing Biomedical Engineering, 2020, pp. 196-202, vol. 39, No. 2.

(Continued)

*Primary Examiner* — Xin Jia
(74) *Attorney, Agent, or Firm* — Bayramoglu Law Offices LLC (57) ABSTRACT

An MPI reconstruction method, device, and system based on a RecNet model include obtaining a one-dimensional (1D) MPI signal on which imaging reconstruction is to be performed, taking the 1D MPI signal as an input signal, and inputting the input signal and a velocity signal of an FFP corresponding to the input signal into a trained magnetic particle reconstruction model RecNet for image reconstruction to obtain a two-dimensional (2D) MPI image, where the magnetic particle reconstruction model RecNet is constructed based on a domain conversion network and an improved UNet network. The MPI reconstruction method, device, and system obtain a high-quality and clear magnetic particle distribution image without obtaining the system matrix.

16 Claims, 7 Drawing Sheets

(56) References Cited

FOREIGN PATENT DOCUMENTS

| | | | |
|---|---|---|---|
| CN | 113808234 A | * | 12/2021 |
| CN | 113808234 A | | 12/2021 |
| CN | 113850883 A | * | 12/2021 |
| CN | 113850883 A | | 12/2021 |
| CN | 113947642 A | | 1/2022 |
| CN | 114403843 A | | 4/2022 |
| CN | 114601442 A | | 6/2022 |
| IN | 114419176 A | | 4/2022 |
| WO | 2018223275 A1 | | 12/2018 |
| WO | 2022016461 A1 | | 1/2022 |
| WO | 2022077158 A1 | | 4/2022 |

OTHER PUBLICATIONS

Di Dong, et al., The role of imaging in the detection and management of COVID-19: a review, IEEE Reviews in Biomedical Engineering, 2020, pp. 1-14.

Tong Tong, et al., Domain Transform Network for Photoacoustic Tomography from Limited-view and Sparsely Sampled Data, Photoacoustics, 2020, pp. 1-31.

Zhengyao Peng, et al., A deep learning-based computational prediction model for characterizing cellular biomarker distribution in tumor microenvironment, Proceedings of SPIE, 2022, pp. 120391H(1-6), vol. 12039.

Jiayi Pan, et al., Multi-domain integrative Swin transformer network for sparse-view tomographic reconstruction, Patterns, 2022, pp. 1-14, vol. 3.

* cited by examiner

MAGNETIC PARTICLE IMAGING (MPI) RECONSTRUCTION METHOD BASED ON RECNET MODEL

CROSS-REFERENCE TO THE RELATED APPLICATION

This application is based upon and claims priority to Chinese Patent Application No. 202210712519.7, filed on Jun. 22, 2022, the entire content of which is incorporated herein by reference.

TECHNICAL FIELD

The present disclosure relates to the field of image reconstruction in magnetic particle imaging (MPI), and specifically, to an MPI reconstruction method and system based on a RecNet model, and a device.

BACKGROUND

As a new tomography technology, MPI has many advantages such as high temporal resolution, no tissue background signal, high sensitivity, and no radiation. It has been proven that the MPI can be used in many medical fields such as cell tracing, angiography, and cancer detection, and is one of most promising new imaging technologies for clinical applications.

MPI reconstruction reconstructs a voltage signal obtained from an MPI device into a distribution map of a magnetic particle concentration. Currently, a reconstruction method based on a system matrix and a reconstruction method based on x-space are mostly used. In the reconstruction method based on a system matrix, it is difficult to obtain a system matrix, and a reconstruction result often contains noise and an artifact. However, a magnetic particle distribution image obtained according to the reconstruction method based on x-space has poor quality and low resolution, which limits the use of the MPI reconstruction results. Therefore, the present disclosure provides an MPI reconstruction method based on a RecNet model.

SUMMARY

In order to resolve the above problems in the prior art, in other words, in order to resolve problems in existing MPI reconstruction methods, for example, it is difficult to obtain a system matrix and a reconstruction result contains noise and an artifact in a reconstruction method based on a system matrix, and a reconstructed image has poor quality and low resolution in a reconstruction method based on x-space, a first aspect of the present disclosure provides an MPI reconstruction method based on a RecNet model. The method includes:

S100: obtaining a one-dimensional (1D) MPI signal on which imaging reconstruction is to be performed, and taking the 1D MPI signal as an input signal; and

S200: inputting the input signal and a velocity signal of a field free point (FFP) corresponding to the input signal into a trained magnetic particle reconstruction model RecNet for image reconstruction to obtain a two-dimensional (2D) MPI image, where the magnetic particle reconstruction model RecNet includes a domain conversion network and an improved UNet network;

the domain conversion network is constructed based on a 1D convolutional layer, a fully connected layer, a concatenation layer, and a spatial feature extraction layer that are sequentially connected;

the 1D convolutional layer is configured to perform 1D convolution processing on the 1D MPI signal and the velocity signal of the FFP separately; the fully connected layer is configured to convert an obtained 1D MPI signal after the 1D convolution processing into a 2D signal that is taken as a first signal, and convert an obtained velocity signal of the FFP after the 1D convolution processing into a 2D signal that is taken as a second signal; and the concatenation layer is configured to concatenate the first signal and the second signal, and take a concatenated signal as a third signal;

the spatial feature extraction layer is constructed based on a plurality of sequentially connected convolutional layers, a batch normalization layer, and a nonlinear activation function, and the spatial feature extraction layer is configured to perform feature extraction on the third signal; and the improved UNet network is constructed based on a UNet network and a plurality of 1×1 convolutional layers, and the 1×1 convolutional layers are connected to an output layer of the UNet network; and the improved UNet network is configured to further extract a feature extracted by the spatial feature extraction layer, and perform image reconstruction to obtain the 2D MPI image.

In some preferred implementations, a method for training the magnetic particle reconstruction model RecNet includes:

A100: obtaining a to-be-reconstructed gray level image, and pre-processing the gray level image;

A200: performing MPI emulation on a pre-processed gray level image to obtain the 1D MPI signal and the velocity signal of the FFP;

A300: inputting the 1D MPI signal and the velocity signal of the FFP into a pre-constructed magnetic particle reconstruction model RecNet for image reconstruction to obtain the 2D MPI image, and taking the 2D MPI image as a reconstructed image;

A400: obtaining a loss value by using a mean square error (MSE) loss function based on the reconstructed image and the to-be-reconstructed gray level image corresponding to the 1D MPI signal and the velocity signal of the FFP that are input into the magnetic particle reconstruction model RecNet, and then performing back propagation to update a parameter of the magnetic particle reconstruction model RecNet; and A500: iterating the steps A100 to A400 until the trained magnetic particle reconstruction model RecNet is obtained.

In some preferred implementations, a method for pre-processing the gray level image includes:

performing interpolation processing on the gray level image to obtain an interpolated gray level image;

randomly clipping the interpolated gray level image, and placing a randomly clipped interpolated gray level image at a specified position of a first image to synthesize a new image, where the first image is an image whose pixel gray-level values are all 0 and whose size is the same as that of the interpolated gray level; and rotating the synthesized image by specified degrees, and taking a rotated image as the pre-processed gray level image, where the specified degrees are an integer multiple of 90 degrees.

In some preferred implementations, a method for performing the MPI emulation on the pre-processed gray level image includes:

linearly converting a pixel gray-level value of the pre-processed gray level image into a magnetic particle concentration signal; and performing the MPI emulation by using a Langevin equation based on the magnetic particle concentration signal and specified emulation parameters, to obtain the 1D MPI signal and the velocity signal of the FFP, where the emulation parameters include magnetic particle temperature, saturation magnetization, an amplitude and a frequency of magnetic field intensity of a driving field, magnetic field intensity of a selection field, a sampling frequency, repeated sampling time, coil sensitivity, and a field of view (FOV).

In some preferred implementations, a method for linearly converting the pixel gray-level value of the pre-processed gray level image into the magnetic particle concentration signal is as follows:

$$c(r)=c_{max}g(r)/g_{max}$$

where c(r) represents a concentration signal of a magnetic particle at a pixel point r of the pre-processed gray level image, g(r) represents a pixel gray-level value at the pixel point r, and $c_{max}$ and $g_{max}$ respectively represent a specified maximum magnetic particle concentration and a specified maximum pixel gray-level value.

In some preferred implementations, a method for obtaining the velocity signal of the FFP includes:

calculating a position of the FFP in an x direction:

$$x_{ffp}=H_{D_x}/G_X$$

where $x_{ffp}$ represents the position of the FFP in the x direction, $H_{D_x}$ represents the magnetic field intensity of the driving field, and $G_x$ represents a change amount of unit-distance magnetic field intensity of the selection field in the x direction; and obtaining a derivative of the position of the FFP in the x direction with respect to time to obtain the velocity signal of the FFP.

A second aspect of the present disclosure provides an MPI reconstruction system based on a RecNet model, including a signal obtaining module and an image reconstruction module, where the signal obtaining module is configured to obtain a 1D MPI signal on which imaging reconstruction is to be performed, and take the 1D MPI signal as an input signal; and the image reconstruction module is configured to input the input signal and a velocity signal of an FFP corresponding to the input signal into a trained magnetic particle reconstruction model RecNet for image reconstruction to obtain a 2D MPI image, where the magnetic particle reconstruction model RecNet includes a domain conversion network and an improved UNet network;

the domain conversion network is constructed based on a 1D convolutional layer, a fully connected layer, a concatenation layer, and a spatial feature extraction layer that are sequentially connected;

the 1D convolutional layer is configured to perform 1D convolution processing on the 1D MPI signal and the velocity signal of the FFP separately; the fully connected layer is configured to convert an obtained 1D MPI signal after the 1D convolution processing into a 2D signal that is taken as a first signal, and convert an obtained velocity signal of the FFP after the 1D convolution processing into a 2D signal that is taken as a second signal; and the concatenation layer is configured to concatenate the first signal and the second signal, and take a concatenated signal as a third signal;

the spatial feature extraction layer is constructed based on a plurality of sequentially connected convolutional layers, a batch normalization layer, and a nonlinear activation function, and the spatial feature extraction layer is configured to perform feature extraction on the third signal; and the improved UNet network is constructed based on a UNet network and a plurality of 1×1 convolutional layers, and the 1×1 convolutional layers are connected to an output layer of the UNet network; and the improved UNet network is configured to further extract a feature extracted by the spatial feature extraction layer, and perform image reconstruction to obtain the 2D MPI image.

A third aspect of the present disclosure provides a device, including: at least one processor and a memory communicatively connected to the at least one processor, where the memory stores an instruction executable by the processor; and the instruction is executed by the processor to implement the above MPI reconstruction method based on a RecNet model.

A fourth aspect of the present disclosure provides a computer-readable storage medium. The computer-readable storage medium stores a computer instruction, and the computer instruction is executed by a computer to implement the above MPI reconstruction method based on a RecNet model.

The present disclosure has following beneficial effects:

The present disclosure can obtain a high-quality and clear magnetic particle distribution image without obtaining a system matrix. Moreover, a gray level value of an image pixel can linearly reflect a magnetic particle concentration, providing a new scheme for MPI reconstruction, which is conducive to interpretation and quantitative analysis of an MPI result.

1) The present disclosure utilizes a deep learning method to construct an end-to-end RecNet model by using a domain conversion network and an improved UNet network, to perform magnetic particle image reconstruction. This makes a reconstruction result directly reflect the magnetic particle concentration, avoids further processing due to coupling between magnetic particle distribution information and other information in an x-space reconstruction result and disadvantages such as a low signal-to-noise ratio of the x-space reconstruction result, and overcomes a problem that an accurate system matrix is required in a reconstruction method based on a system matrix.

2) The present disclosure can process an image with a certain distribution feature, which is beneficial to avoiding an impact of the distribution feature on a reconstruction result.

BRIEF DESCRIPTION OF THE DRAWINGS

Other features, objectives and advantages of the present disclosure will become more apparent upon reading the detailed description of the non-restrictive embodiments made below with reference to the accompanying drawings.

DETAILED DESCRIPTION OF THE EMBODIMENTS

In order to make the objectives, technical solutions, and advantages of the present disclosure clearer, the technical solutions in the embodiments of the present disclosure are described clearly and completely below with reference to the accompanying drawings. Apparently, the described embodiments are part rather than all of the embodiments of the present disclosure. All other embodiments obtained by a person of ordinary skill in the art based on the embodiments of the present disclosure without creative efforts shall fall within the protection scope of the present disclosure.

The present disclosure will be further described in detail below in conjunction with the accompanying drawings and embodiments. It should be understood that the specific embodiments described herein are merely intended to explain the present disclosure, rather than to limit the present disclosure. It should also be noted that, for convenience of description, only the parts related to the present disclosure are shown in the accompanying drawings.

It should be noted that the embodiments in the present disclosure and features in the embodiments may be combined with each other in a non-conflicting situation.

Figure 1:
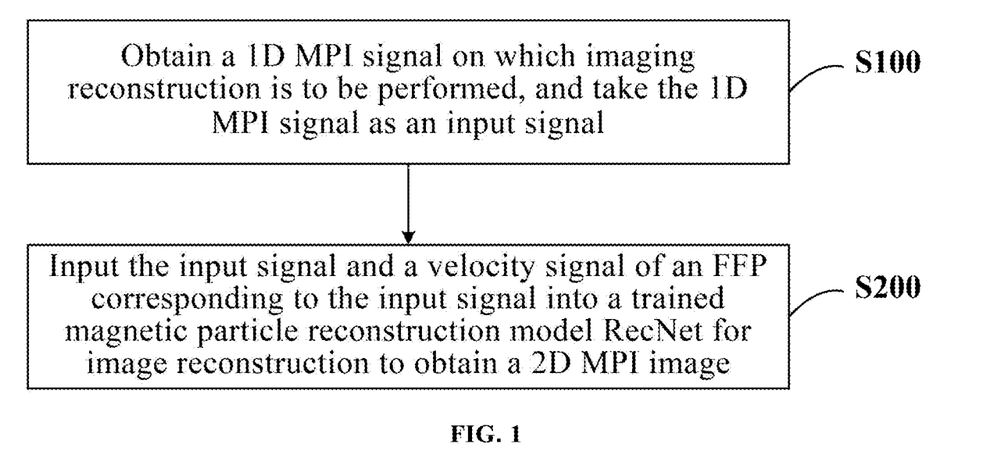
FIG. 1 is a schematic flowchart of an MPI reconstruction method based on a RecNet model according to an embodiment of the present disclosure.

As shown in FIG. 1, an MPI reconstruction method based on a RecNet model in the present disclosure includes following steps:

S100: A 1D MPI signal on which imaging reconstruction is to be performed is obtained as an input signal.

S200: The input signal and a velocity signal of an FFP corresponding to the input signal are input into a trained magnetic particle reconstruction model RecNet for image reconstruction to obtain a 2D MPI image.

The magnetic particle reconstruction model RecNet includes a domain conversion network and an improved UNet network.

The domain conversion network is constructed based on a 1D convolutional layer, a fully connected layer, a concatenation layer, and a spatial feature extraction layer that are sequentially connected.

The 1D convolutional layer is configured to perform 1D convolution processing on the 1D MPI signal and the velocity signal of the FFP separately; the fully connected layer is configured to convert an obtained 1D MPI signal after the 1D convolution processing into a 2D signal that is taken as a first signal, and convert an obtained velocity signal of the FFP after the 1D convolution processing into a 2D signal that is taken as a second signal; and the concatenation layer is configured to concatenate the first signal and the second signal, and take a concatenated signal as a third signal.

The spatial feature extraction layer is constructed based on a plurality of sequentially connected convolutional layers, a batch normalization layer, and a nonlinear activation function, and the spatial feature extraction layer is configured to perform feature extraction on the third signal.

The improved UNet network is constructed based on a UNet network and a plurality of 1×1 convolutional layers, and the 1×1 convolutional layers are connected to an output layer of the UNet network; and the improved UNet network is configured to further extract a feature extracted by the spatial feature extraction layer, and perform image reconstruction to obtain the 2D MPI image.

To more clearly describe the MPI reconstruction method based on a RecNet model in the present disclosure, steps in an embodiment of the method in the present disclosure are described in detail below with reference to the accompanying drawings.

In following embodiments, a training process of the magnetic particle reconstruction model RecNet is described in detail, and then a process of image reconstruction using the MPI reconstruction method based on a RecNet model is described in detail.

Figure 8:
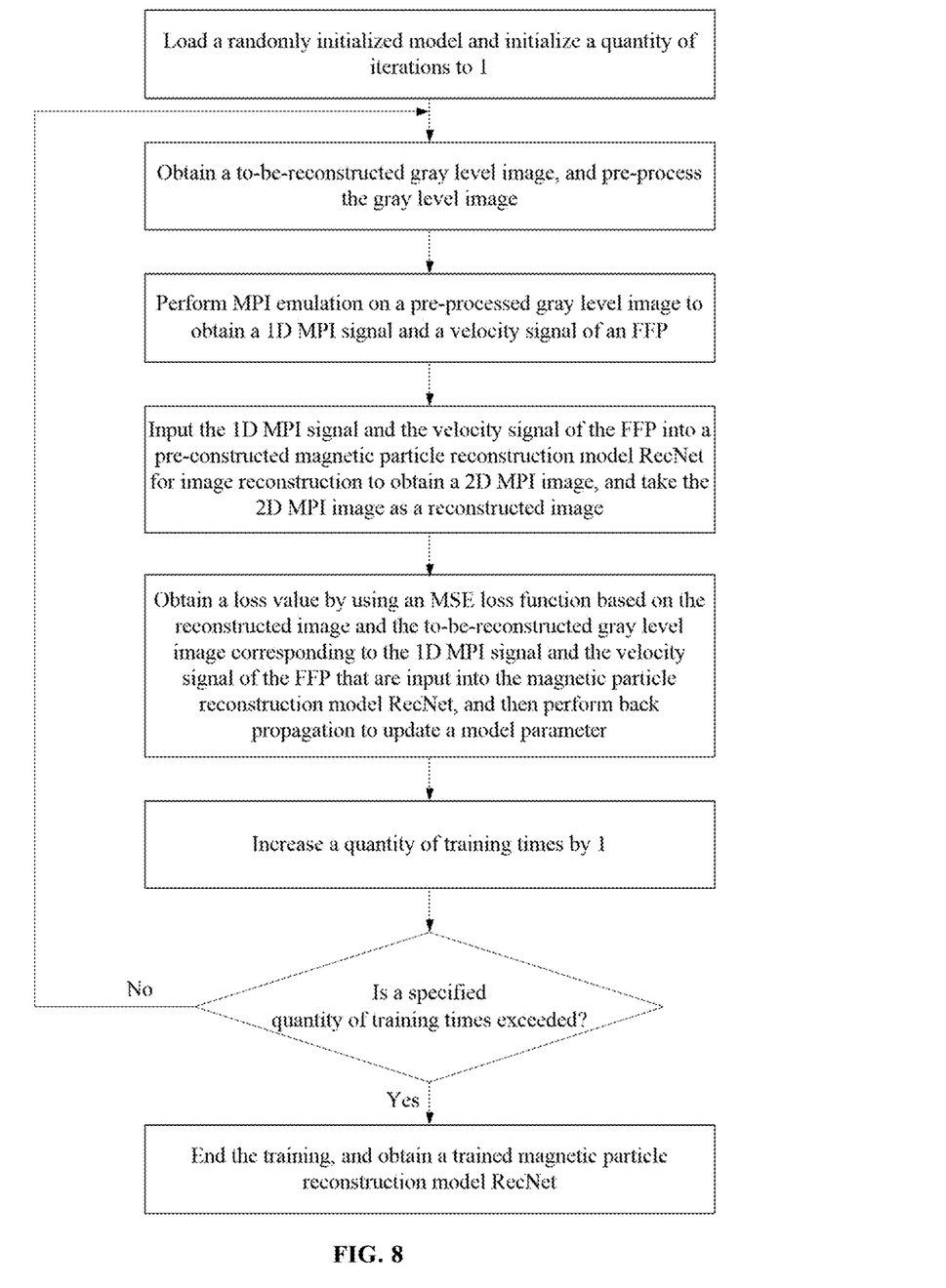
FIG. 8 is a schematic diagram of a training process of a magnetic particle reconstruction model RecNet according to an embodiment of the present disclosure.

1. As shown in FIG. 8, the training process of the magnetic particle reconstruction model RecNet includes following steps.

A100: A to-be-reconstructed gray level image is obtained and pre-processed.

Figure 3A:
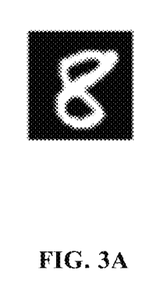
FIG. 3A and 3B schematically shows gray level images before and after pre-processing according to an embodiment of the present disclosure.

In this embodiment, the to-be-reconstructed gray level image is first obtained as a label. In the present disclosure, the image is preferably selected from MNIST and Fashion MNIST datasets, as shown in FIG. 3A, and then the selected image is pre-processed. The preprocessing process is as follows:

Interpolation processing is performed on the gray level image to obtain an interpolated gray level image. A size of the gray level image selected from the MNIST and Fashion MNIST datasets is 28×28. In the present disclosure, the 28×28 gray level image is preferably interpolated to obtain a 121×121 interpolated gray level image.

The interpolated gray level image is randomly clipped to mainly remove distribution information of the image itself, such as a position of a main part of the image in the middle of the image. The image is randomly clipped by generating a rectangular frame of a random size first and then randomly selecting a position in the image as a clipping region for clipping. In this embodiment, a size of a side length of the rectangular frame is a random value ranging from 20 to 121.

After the clipping, a randomly clipped interpolated gray level image is placed at a specified position of a first image to synthesize a new image. The first image is an image whose pixel gray-level values are all 0 (namely, an all-black image) and whose size is the same as that of the interpolated gray level. The specified position may be randomly selected from all positions at which the clipped image can be placed.

Figure 3B:
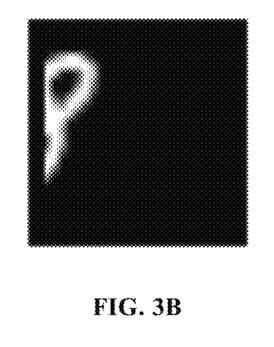

The synthesized image is rotated by specified degrees, and a rotated image is taken as the pre-processed gray level image, as shown in FIG. 3B. The specified degrees are an integer multiple of 90 degrees.

A200: MPI emulation is performed on a pre-processed gray level image to obtain the 1D MPI signal and the velocity signal of the FFP.

In this embodiment, a specific process for performing the MPI emulation on the pre-processed gray level image includes following steps:

A pixel gray-level value of the pre-processed gray level image is linearly converted into a magnetic particle concentration signal, which is specifically shown in formula (1):

$$c(r)=c_{max}g(r)/g_{max} \qquad (1)$$

where c(r) represents a concentration signal of a magnetic particle at pixel point r of the pre-processed gray level image, g(r) represents a pixel gray-level value at the pixel point r, and $c_{max}$ and $g_{max}$ respectively represent a specified maximum magnetic particle concentration and a specified maximum pixel gray-level value. In the present disclosure, the maximum magnetic particle concentration is preferably set to $5\times10^7$ mmol/L, and the maximum pixel gray-level value is preferably set to 255.

Figure 4:
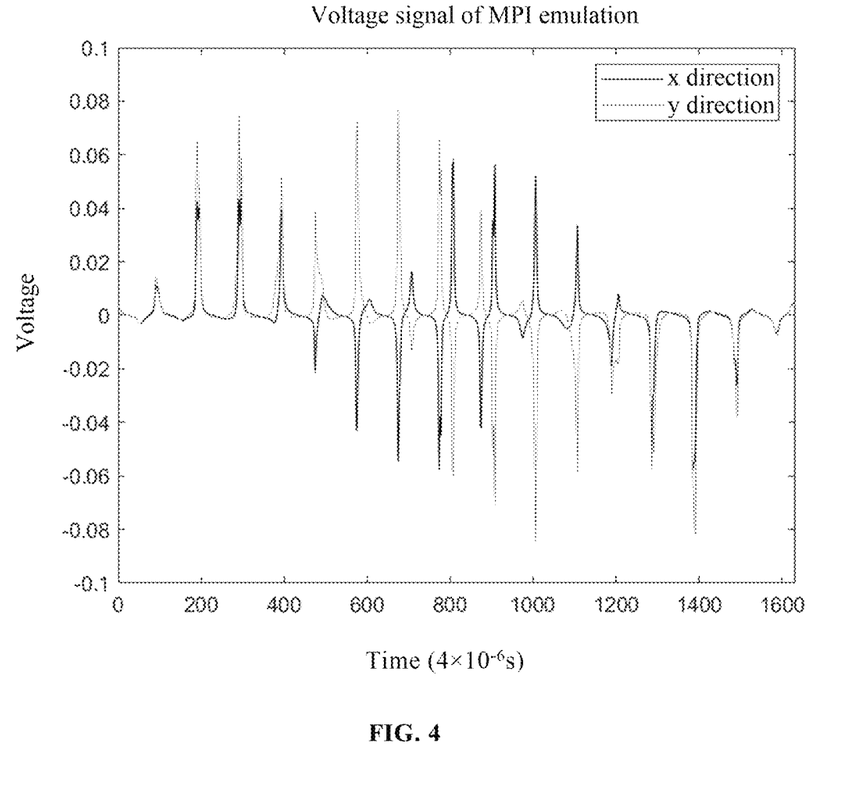
FIG. 4 shows an example of data obtained through MPI emulation according to an embodiment of the present disclosure.

The MPI emulation is performed by using a Langevin equation based on the magnetic particle concentration signal and specified emulation parameters, to obtain the 1D MPI signal and the velocity signal of the FFP. The 1D MPI signal obtained through the MPI emulation is shown in FIG. 4.

In the present disclosure, an MPI emulation environment is specified to emulate the MPI signal. The specified emulation parameters include magnetic particle temperature, which is preferably set to 20° C.; saturation magnetization, which is preferably set to $8\times10^5$ A/m; an amplitude and a frequency of magnetic field intensity of a driving field, which are preferably set to 12 mT×12 mT and 2.5/102 MHz×2.5/96 MHz respectively; magnetic field intensity of a selection field, which is preferably set to 2.0 T×2.0 T; a sampling frequency, which is preferably set to 2.5 MHz; repeated sampling time, which is preferably set to $6.528\times10^{-4}$ s; coil sensitivity, which is preferably set to 1.0, and an FOV, which is preferably set to 12.1 mm×12.1 mm.

In addition, a method for obtaining the velocity signal of the FFP includes:

calculating a position of the FFP in an x direction:

$$x_{ffp}=H_{D_x}/G_x \qquad (2)$$

where $x_{ffp}$ represents the position of the FFP in the x direction, $H_{D_x}$ represents the magnetic field intensity of the driving field, and $G_x$ represents a change amount of unit-distance magnetic field intensity of the selection field in the x direction; and obtaining a derivative of the position of the FFP in the x direction with respect to time to obtain the velocity signal of the FFP, where the velocity signal of the FFP is the derivative of the position of the FFP with respect to the time. A voltage signal (namely, the 1D MPI signal) and the velocity signal of the FFP are stored as emulation results.

A300: The 1D MPI signal and the velocity signal of the FFP are input into a pre-constructed magnetic particle reconstruction model RecNet for image reconstruction to obtain the 2D MPI image, and the 2D MPI image is taken as a reconstructed image.

In this embodiment, the magnetic particle reconstruction model RecNet includes the domain conversion network and the improved UNet network.

Figure 5:
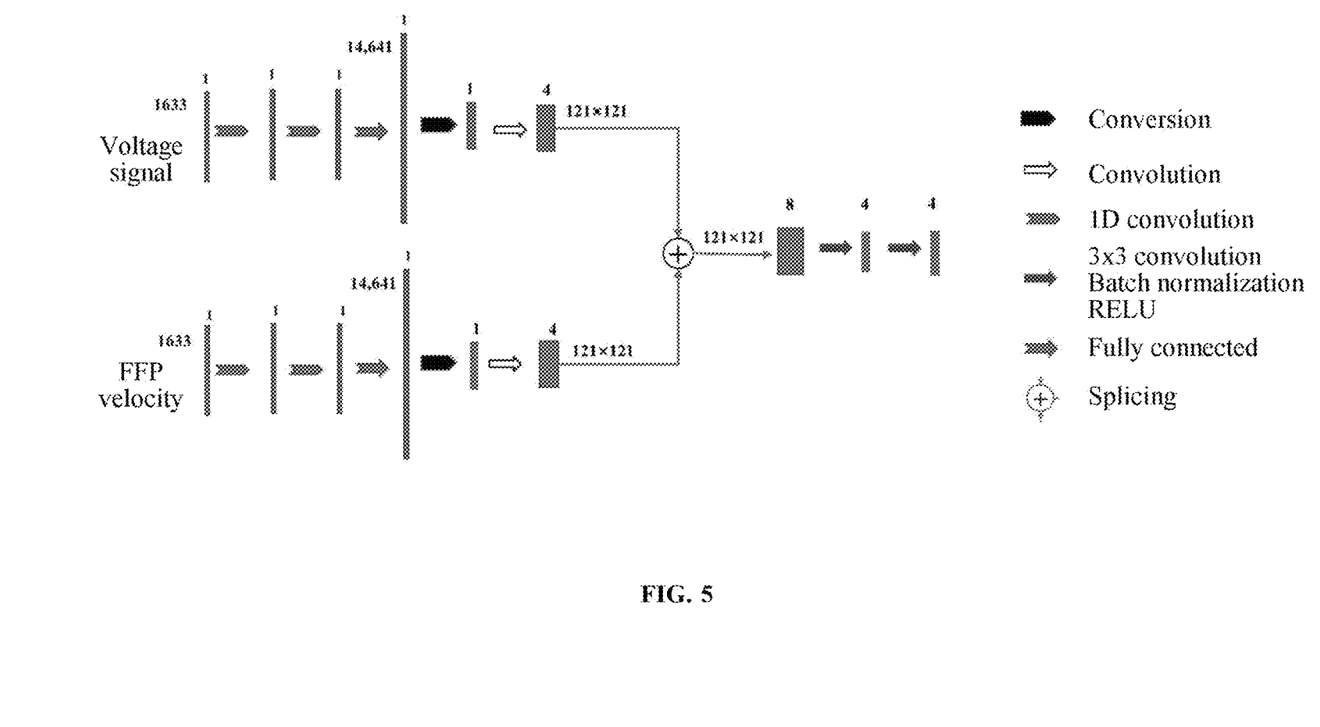
FIG. 5 is a schematic structural diagram of a domain conversion network in a magnetic particle reconstruction model RecNet according to an embodiment of the present disclosure.

The domain conversion network is constructed based on the 1D convolutional layer, the fully connected layer, the concatenation layer, and the spatial feature extraction layer that are sequentially connected, to convert the voltage signal and FFP information into a 2D signal in an image domain. As shown in FIG. 5, numbers above rectangles in FIG. 5, such as 1, 4, and 8, represent quantities of channels at corresponding layers (which is the same as that in FIGS. 6), and "1633" and "14641" each represent an amount of data in each channel. A specific conversion process is as follows:

The 1D convolutional layer is configured to perform the 1D convolution processing on the 1D MPI signal and the velocity signal of the FFP separately. In other words, the 1D signal is first processed using a form of 1D convolution, to extract timing information from the signal. In this embodiment, it can be verified based on an ablation experiment that the 1D convolution has a significant impact on quality of MPI reconstruction.

The fully connected layer is configured to convert the obtained 1D MPI signal after the 1D convolution processing into the 2D signal that is taken as the first signal, and convert the obtained velocity signal of the FFP after the 1D convolution processing into the 2D signal that is taken as the second signal. In other words, domain conversion is performed by using the fully connected layer after the 1D convolution processing is performed on the 1D MPI signal and the velocity signal of the FFP. This increases a parameter size of the model, but can most directly convert the 1D signal into the 2D signal.

The concatenation layer is configured to concatenate the first signal and the second signal, and take the concatenated signal as the third signal. In other words, after the convolution processing, channel concatenation is performed on a 2D feature map obtained based on these two signals.

The spatial feature extraction layer is constructed based on the sequentially connected convolutional layers, the batch normalization layer, and the nonlinear activation function, and the spatial feature extraction layer is configured to perform the feature extraction on the third signal. In other words, in order to perform preliminary feature extraction, the convolutional layers, the batch standardization layer, and the nonlinear activation function are added. On a basis of further extracting a data feature, two different signal features are fused, and a nonlinear operation is added. At this time, a feature obtained is a feature map obtained after conversion and simple extraction.

Figure 6:
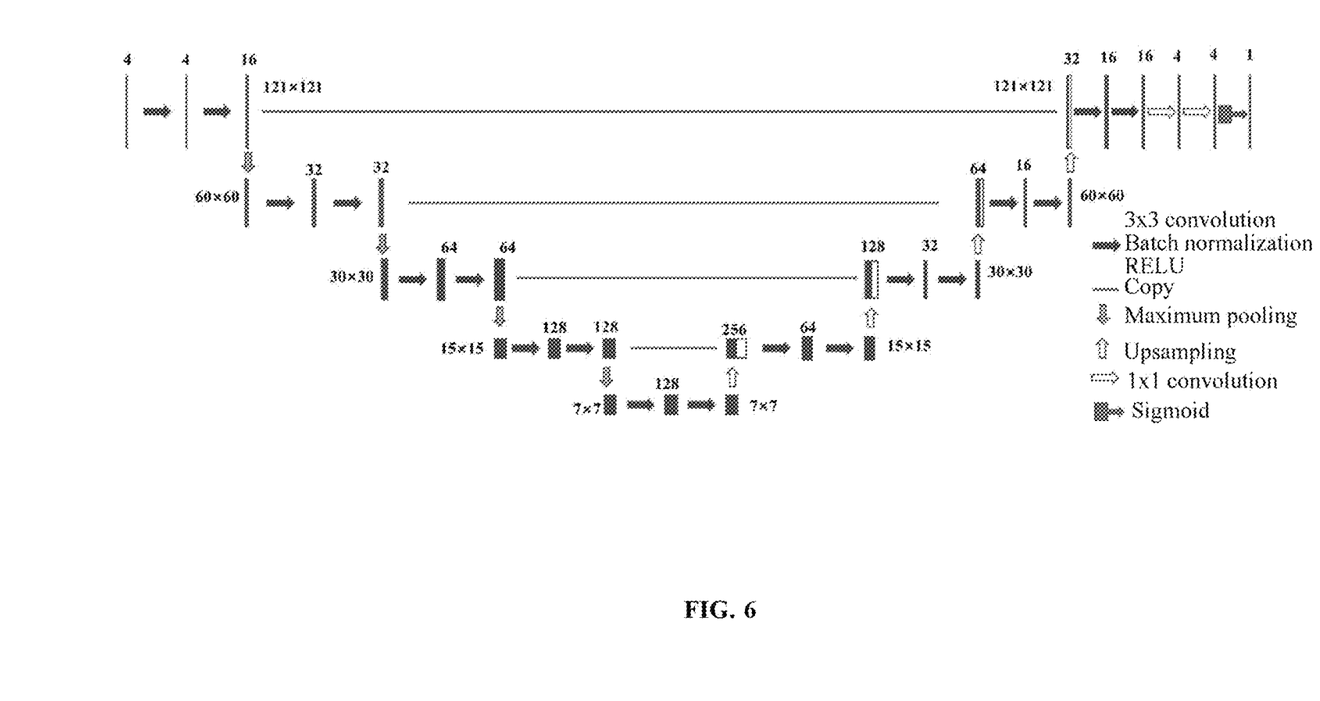
FIG. 6 is a schematic structural diagram of an improved UNet network in a magnetic particle reconstruction model RecNet according to an embodiment of the present disclosure.

The improved UNet network is constructed based on the UNet network and the 1×1 convolutional layers, and the 1×1 convolutional layers are connected to the output layer of the UNet network, as shown in FIG. 6. The improved UNet network is configured to further extract the feature extracted by the spatial feature extraction layer, and perform image reconstruction to obtain the 2D MPI image, as shown in FIG. 7.

In the present disclosure, the feature map is input into an improved UNet network model. The UNet network is of an encoder-decoder structure, and its effectiveness has been widely verified. UNet is configured to extract a deep feature in the RecNet. A structure and an operation of the UNet are basically maintained except for changes to a quantity of channels and a size of the feature map. In this embodiment, using the UNet for magnetic particle concentration reconstruction is essentially to perform regression prediction for each position. Therefore, a plurality of 1×1 convolutional layers are added at an output layer of the model, the quantity of channels of the feature map is decreased to 1, and a sigmoid function is used as an activation function of a last layer.

A400: A loss value is obtained by using an MSE loss function based on the reconstructed image and the to-be-reconstructed gray level image corresponding to the 1D MPI signal and the velocity signal of the FFP that are input into the magnetic particle reconstruction model RecNet, and then back propagation is performed to update a parameter of the magnetic particle reconstruction model RecNet.

Figure 7:
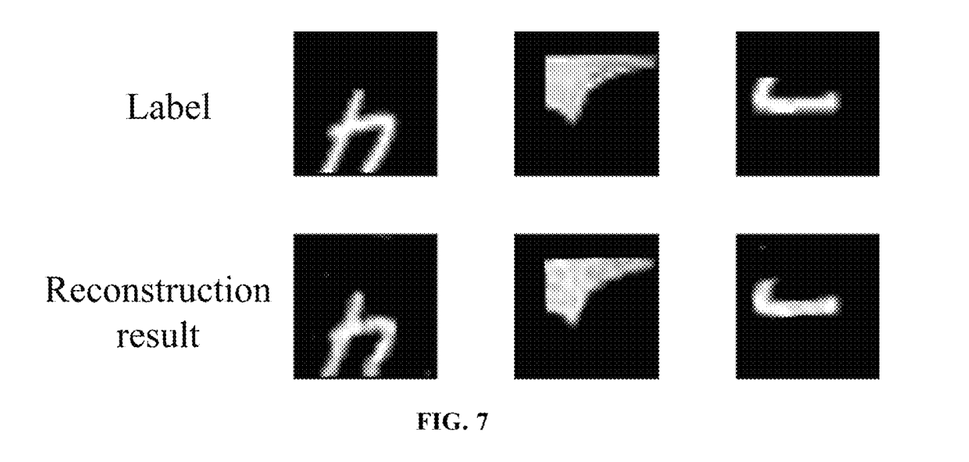
FIG. 7 schematically shows a result of MPI reconstruction based on a magnetic particle reconstruction model RecNet according to an embodiment of the present disclosure.

In this embodiment, the to-be-reconstructed gray level image corresponding to the 1D MPI signal and the velocity signal of the FFP that are input into the magnetic particle reconstruction model RecNet is used as a truth-value label (namely, a label in FIG. 7). In combination with the reconstructed image, the back propagation is preferably performed on the model by using the MSE loss function, to perform parameter adjustment. In other embodiments, the loss function may be selected according to actual needs.

A500: The steps A100 to A400 are iterated until the trained magnetic particle reconstruction model RecNet is obtained.

In this embodiment, if a quantity of training times does not reach a preset quantity of training times, the steps A100 to A400 are continued to be iterated. Otherwise, the training ends, and the trained magnetic particle reconstruction model RecNet is obtained.

2. MPI reconstruction method based on a RecNet model

S100: A 1D MPI signal on which imaging reconstruction is to be performed is obtained as an input signal.

In this embodiment, the 1D MPI signal on which imaging reconstruction is to be performed is obtained first. In the present disclosure, the 1D MPI signal on which imaging reconstruction is to be performed is preferably obtained by using an MPI device. The MPI device is an existing device and will not be described in detail herein.

S200: The input signal and a velocity signal of an FFP corresponding to the input signal are input into a trained magnetic particle reconstruction model RecNet for image reconstruction to obtain a 2D MPI image.

In this embodiment, when the input signal is collected, magnetic field intensity $H_{D_x}$ of a driving field, and change amount $G_x$ of unit-distance magnetic field intensity of a selection field in an x direction are obtained. Based on the $H_{D_x}$ and the $G_x$, position $x_{ffp}$ of the FFP in the x direction is calculated (a specific calculation process is shown in the above formula (2)), and a derivative of the $x_{ffp}$ is obtained to obtain the velocity signal of the FFP corresponding to the input signal. The input signal and the velocity signal of the FFP corresponding to the input signal are input into the above trained magnetic particle reconstruction model RecNet for image reconstruction to obtain the 2D MPI image.

Figure 2:
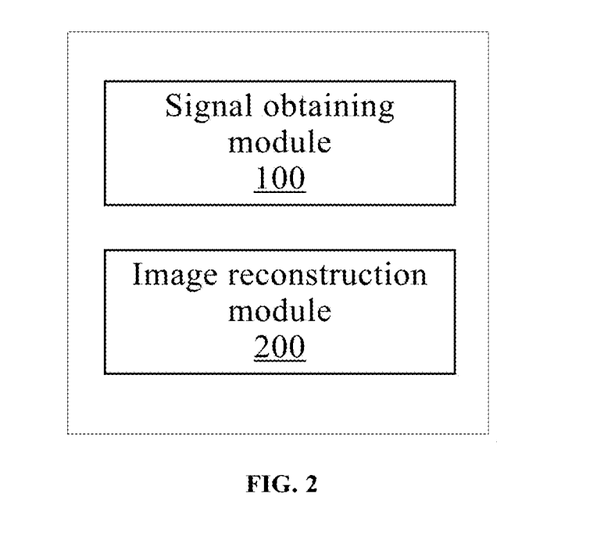
FIG. 2 is a schematic frame diagram of an MPI reconstruction system based on a RecNet model according to an embodiment of the present disclosure.

As shown in FIG. 2, an MPI reconstruction system based on a RecNet model according to a second embodiment of the present disclosure includes signal obtaining module 100 and image reconstruction module 200.

The signal obtaining module 100 is configured to obtain a 1D MPI signal on which imaging reconstruction is to be performed, and take the 1D MPI signal as an input signal.

The image reconstruction module 200 is configured to input the input signal and a velocity signal of an FFP corresponding to the input signal into a trained magnetic particle reconstruction model RecNet for image reconstruction to obtain a 2D MPI image.

The magnetic particle reconstruction model RecNet includes a domain conversion network and an improved UNet network.

The domain conversion network is constructed based on a 1D convolutional layer, a fully connected layer, a concatenation layer, and a spatial feature extraction layer that are sequentially connected.

the 1D convolutional layer is configured to perform 1D convolution processing on the 1D MPI signal and the velocity signal of the FFP separately; the fully connected layer is configured to convert an obtained 1D MPI signal after the 1D convolution processing into a 2D signal that is taken as a first signal, and convert an obtained velocity signal of the FFP after the 1D convolution processing into a 2D signal that is taken as a second signal; and the concatenation layer is configured to concatenate the first signal and the second signal, and take a concatenated signal as a third signal;

The spatial feature extraction layer is constructed based on a plurality of sequentially connected convolutional layers, a batch normalization layer, and a nonlinear activation function, and the spatial feature extraction layer is configured to perform feature extraction on the third signal.

The improved UNet network is constructed based on a UNet network and a plurality of 1×1 convolutional layers, and the 1×1 convolutional layers are connected to an output layer of the UNet network; and the improved UNet network is configured to further extract a feature extracted by the spatial feature extraction layer, and perform image reconstruction to obtain the 2D MPI image.

It should be noted that the MPI reconstruction system based on a RecNet model in the above embodiments is only described by taking the division of the above functional modules as an example. In practical applications, the above functions can be completed by different functional modules as required, that is, the modules or steps in the embodiments of the present disclosure are further decomposed or combined. For example, the modules in the above embodiments may be combined into one module, or may be further divided into a plurality of sub-modules to complete all or part of the functions described above. The names of the modules and steps involved in the embodiments of the present disclosure are only for distinguishing each module or step, and should not be regarded as improper limitations on the present disclosure.

A device according to a third embodiment of the present disclosure includes: at least one processor and a memory communicatively connected to the at least one processor, where the memory stores an instruction executable by the processor; and the instruction is executed by the processor to implement the above MPI reconstruction method based on a RecNet model.

A computer-readable storage medium according to a fourth embodiment of the present disclosure stores a computer instruction, and the computer instruction is executed by a computer to implement the above MPI reconstruction method based on a RecNet model.

Those skilled in the art can clearly understand that, for convenience and brevity of description, reference can be made to a corresponding process in the foregoing method embodiment for specific working processes and related descriptions of the above-described storage apparatus and processing apparatus. Details are not described herein again.

Figure 9:
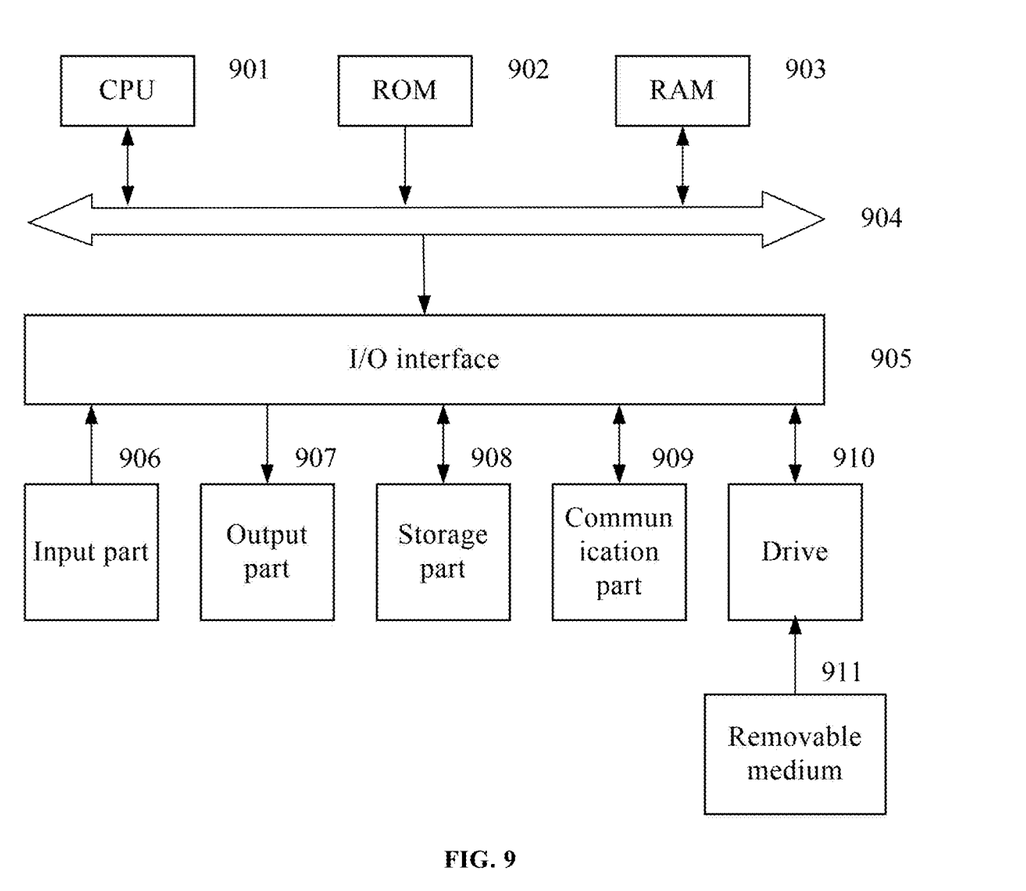
FIG. 9 is a structural diagram of a computer system of an electronic device suitable for implementing the embodiments of the present disclosure according to an embodiment of the present disclosure.

FIG. 9 shows a schematic structural diagram of a computer system of a server suitable for implementing the method, system and apparatus embodiments of the present disclosure. The server shown in FIG. 9 is merely an example, and should not be conceived as any limitation to the functions and application range of the embodiments of the present disclosure.

As shown in FIG. 9, the computer system includes central processing unit (CPU) 901, which can perform various suitable actions and processing according to a program stored in read-only memory (ROM) 902 or a program loaded from storage part 908 to random access memory (RAM) 903. The RAM 903 further stores various programs and data required for operations of the system. The CPU 901, the ROM 902, and the RAM 903 are connected to one another through bus 904. Input/output (I/O) interface 905 is connected to the bus 904.

The following components are connected to the I/O interface 905: input part 906 including a keyboard, a mouse, and the like; output part 907 including a cathode-ray tube (CRT), a liquid crystal display (LCD), a loudspeaker, and the like; the storage part 908 including a hard disk and the like; and communication part 909 including a network interface card such as a local area network (LAN) card or a modem. The communication part 909 performs communication processing through a network such as the Internet. Drive 910 is also connected to the I/O interface 905 as needed. Removable medium 911, such as a magnetic disk, an optical disk, a magneto-optical disk, or a semiconductor memory, is mounted on the drive 910 as needed, such that a computer program read therefrom is installed into the storage part 908 as needed.

Particularly, according to the embodiments of the present disclosure, the process described above with reference to the flowchart may be implemented as a computer software program. For example, an embodiment of the present disclosure includes a computer program product including a computer program carried by a computer-readable medium. The computer program includes program code for executing the method shown in the flowchart. In this embodiment, the computer program may be downloaded from a network by means of the communication part 909 and installed, and/or be installed from the removable medium 911. When the computer program is executed by the CPU 901, the functions defined in the method of the present disclosure are executed. It should be noted that, the computer-readable medium in the present disclosure may be a computer-readable signal medium, a computer-readable storage medium, or a combination thereof. The computer-readable storage medium, may be, for example, but not limited to, electrical, magnetic, optical, electromagnetic, infrared, or semiconductor systems, apparatuses, or devices, or any combination thereof. More specific examples of the computer-readable storage medium may include, but are not limited to: an electric connector with one or more wires, a portable computer magnetic disk, a hard disk, a RAM, a ROM, an erasable programmable read-only memory (EPROM or flash memory), an optical fiber, a portable compact disk read-only memory (CD-ROM), an optical storage device, a magnetic storage device, or any proper combination thereof. In the present disclosure, the computer-readable storage medium may be any tangible medium including or storing a program, and the program may be used by or used in combination with an instruction execution system, apparatus or device. In the present disclosure, the computer-readable signal medium may include a data signal propagated in a baseband or propagated as a part of a carrier, and carries computer-readable program code. The propagated data signal may be in various forms, including but not limited to an electromagnetic signal, an optical signal, or any suitable combination thereof. The computer-readable signal medium may alternatively be any computer-readable medium except the computer-readable storage medium. The computer-readable medium may send, propagate or transmit a program used by or used in combination with an instruction execution system, apparatus or device. The program code contained on the computer-readable medium may be transmitted using any suitable medium, including but not limited to: wireless, wire, optical fiber, RF, or any suitable combination thereof.

The computer program code for executing the operations in the present disclosure may be compiled by using one or more program design languages or a combination thereof. The programming languages include object oriented programming languages, such as Java, Smalltalk, and C++, and conventional procedural programming languages, such as C or similar programming languages. The program code may be executed fully on a user computer, executed partially on a user computer, executed as an independent software package, executed partially on a user computer and partially on a remote computer, or executed fully on a remote computer or a server. When a remote computer is involved, the remote computer may be connected to the user computer via any type of network including a LAN or a wide area network (WAN), or may be connected to an external computer (for example, connected via the Internet by using an Internet service provider).

The flowcharts and block diagrams in the accompanying drawings illustrate system architectures, functions and operations that may be implemented by the system, method and computer program product according to the embodiments of the present disclosure. In this regard, each block in the flowcharts or block diagrams may represent a module, a program segment or a part of code, and the module, the program segment or the part of code includes one or more executable instructions for implementing specified logic functions. It should also be noted that, in some alternative implementations, the functions marked in the blocks may alternatively be performed in an order different from that marked in the drawings. For example, two successively shown blocks actually may be executed in parallel substantially, or may be executed in reverse order sometimes, depending on the functions involved. It should also be noted that each block in the block diagrams and/or flowcharts and combinations of the blocks in the block diagrams and/or flowcharts may be implemented by a dedicated hardware-based system for executing specified functions or operations, or may be implemented by a combination of dedicated hardware and computer instructions.

Terms such as "first" and "second" are intended to distinguish between similar objects, rather than describe or indicate a specific order or sequence.

Terms "include", "comprise" or any other variations thereof are intended to cover non-exclusive inclusions, such that a process, a method, an article, or a device/apparatus including a series of elements not only includes those elements, but also includes other elements that are not explicitly listed, or also includes inherent elements of the process, the method, the article or the device/apparatus.

The technical solutions of the present disclosure are described with reference to the preferred implementations shown in the accompanying drawings. Those skilled in the art should easily understand that the protection scope of the present disclosure is apparently not limited to these specific implementations. Those skilled in the art can make equivalent changes or substitutions to the relevant technical features without departing from the principles of the present disclosure, and the technical solutions after these changes or substitutions should fall within the protection scope of the present disclosure.

What is claimed is:

1. A magnetic particle imaging (MPI) reconstruction method based on a RecNet model, wherein the method comprises following steps:

S100: obtaining a one-dimensional (1D) MPI signal on which imaging reconstruction is to be performed, and taking the 1D MPI signal as an input signal; and S200: inputting the input signal and a velocity signal of a field free point (FFP) corresponding to the input signal into a trained magnetic particle reconstruction model RecNet for image reconstruction to obtain a two-dimensional (2D) MPI image, wherein
the velocity signal of the FFP is obtained by:
calculating a position of the FFP in an x direction:

$$x_{ffp} = H_{D_x}/G_x$$

wherein $x_{ffp}$ represents the position of the FFP in the x direction, $H_{D_x}$ represents magnetic field intensity of a driving field, and $G_x$ represents a change amount of unit-distance magnetic field intensity of a selection field in the x direction; and obtaining a derivative of the position of the FFP in the x direction with respect to time to obtain the velocity signal of the FFP;

the magnetic particle reconstruction model RecNet comprises a domain conversion network and an improved UNet network;

the domain conversion network is constructed based on a 1D convolutional layer, a fully connected layer, a concatenation layer, and a spatial feature extraction layer that are sequentially connected;

the 1D convolutional layer is configured to perform 1D convolution processing on the 1D MPI signal and the velocity signal of the FFP separately; the fully connected layer is configured to convert an obtained 1D MPI signal after the 1D convolution processing into a 2D signal that is taken as a first signal, and convert an obtained velocity signal of the FFP after the 1D convolution processing into a 2D signal that is taken as a second signal; and the concatenation layer is configured to concatenate the first signal and the second signal, and take a concatenated signal as a third signal;

the spatial feature extraction layer is constructed based on a plurality of sequentially connected convolutional layers, a batch normalization layer, and a nonlinear activation function, and the spatial feature extraction layer is configured to perform feature extraction on the third signal; and the improved UNet network is constructed based on a UNet network and a plurality of 1×1 convolutional layers, and the 1×1 convolutional layers are connected to an output layer of the UNet network; and the improved UNet network is configured to further extract a feature extracted by the spatial feature extraction layer, and perform image reconstruction to obtain the 2D MPI image.

2. The MPI reconstruction method based on the RecNet model according to claim 1, further comprises a method for training the magnetic particle reconstruction model RecNet, and the method for training the magnetic particle reconstruction model RecNet comprises:

A100: obtaining a to-be-reconstructed gray level image, and pre-processing the gray level image;

A200: performing MPI emulation on a pre-processed gray level image to obtain the 1D MPI signal and the velocity signal of the FFP;

A300: inputting the 1D MPI signal and the velocity signal of the FFP into a pre-constructed magnetic particle reconstruction model RecNet for image reconstruction to obtain the 2D MPI image, and taking the 2D MPI image as a reconstructed image;

A400: obtaining a loss value by using a mean square error (MSE) loss function based on the reconstructed image and the to-be-reconstructed gray level image corresponding to the 1D MPI signal and the velocity signal of the FFP that are input into the magnetic particle reconstruction model RecNet, and then performing back propagation to update a parameter of the magnetic particle reconstruction model RecNet; and A500: iterating the steps A100 to A400 until the trained magnetic particle reconstruction model RecNet is obtained.

3. The MPI reconstruction method based on the RecNet model according to claim 2, wherein the pre-processing of the gray level image comprises:

performing interpolation processing on the gray level image to obtain an interpolated gray level image;

randomly clipping the interpolated gray level image, and placing a randomly clipped interpolated gray level image at a specified position of a first image to synthesize a new image, wherein the first image is an image whose pixel gray-level values are all 0 and whose size is the same as that of the interpolated gray level; and rotating the synthesized image by specified degrees, and taking a rotated image as the pre-processed gray level image, wherein the specified degrees are an integer multiple of 90 degrees.

4. The MPI reconstruction method based on the RecNet model according to claim 2, wherein the performing of the MPI emulation on the pre-processed gray level image comprises:

linearly converting a pixel gray-level value of the pre-processed gray level image into a magnetic particle concentration signal; and performing the MPI emulation by using a Langevin equation based on the magnetic particle concentration signal and specified emulation parameters, to obtain the 1D MPI signal and the velocity signal of the FFP, wherein the emulation parameters comprise magnetic particle temperature, saturation magnetization, an amplitude and a frequency of the magnetic field intensity of the driving field, the magnetic field intensity of the selection field, a sampling frequency, repeated sampling time, coil sensitivity, and a field of view (FOV).

5. The MPI reconstruction method based on the RecNet model according to claim 4, wherein the linearly converting of the pixel gray-level value of the pre-processed gray level image into the magnetic particle concentration signal is as follows:

$$c(r) = c_{max} g(r) / g_{max}$$

wherein $c(r)$ represents a concentration signal of a magnetic particle at a pixel point r of the pre-processed gray level image, $g(r)$ represents a pixel gray-level value at the pixel point r, and $c_{max}$ and $g_{max}$ respectively represent a specified maximum magnetic particle concentration and a specified maximum pixel gray-level value.

6. An MPI reconstruction system based on a RecNet model, wherein the system comprises a signal obtaining module and an image reconstruction module, wherein the signal obtaining module is configured to obtain a 1D MPI signal on which imaging reconstruction is to be performed, and take the 1D MPI signal as an input signal; and the image reconstruction module is configured to input the input signal and a velocity signal of an FFP corresponding to the input signal into a trained magnetic particle reconstruction model RecNet for image reconstruction to obtain a 2D MPI image, wherein a method for obtaining the velocity signal of the FFP comprises:

calculating a position of the FFP in an x direction:

$$x_{ffp}=H_{D_x}/G_x$$

wherein $x_{ffp}$ represents the position of the FFP in the x direction, $H_{D_x}$ represents magnetic field intensity of a driving field, and $G_x$ represents a change amount of unit-distance magnetic field intensity of a selection field in the x direction; and obtaining a derivative of the position of the FFP in the x direction with respect to time to obtain the velocity signal of the FFP;

the magnetic particle reconstruction model RecNet comprises a domain conversion network and an improved UNet network;

the domain conversion network is constructed based on a 1D convolutional layer, a fully connected layer, a concatenation layer, and a spatial feature extraction layer that are sequentially connected;

the 1D convolutional layer is configured to perform 1D convolution processing on the 1D MPI signal and the velocity signal of the FFP separately; the fully connected layer is configured to convert an obtained 1D MPI signal after the 1D convolution processing into a 2D signal that is taken as a first signal, and convert an obtained velocity signal of the FFP after the 1D convolution processing into a 2D signal that is taken as a second signal; and the concatenation layer is configured to concatenate the first signal and the second signal, and take a concatenated signal as a third signal;

the spatial feature extraction layer is constructed based on a plurality of sequential connected convolutional layers, a batch normalization layer, and a nonlinear activation function, and the spatial feature extraction layer is configured to perform feature extraction on the third signal; and the improved UNet network is constructed based on a UNet network and a plurality of 1×1 convolutional layers, and the 1×1 convolutional layers are connected to an output layer of the UNet network; and the improved UNet network is configured to further extract a feature extracted by the spatial feature extraction layer, and perform image reconstruction to obtain the 2D MPI image.

7. An electronic device, comprising:

at least one processor and a memory communicatively connected to the at least one processor, wherein the memory stores an instruction executable by the processor; and the instruction is executed by the processor to implement the MPI reconstruction method based on the RecNet model according to claim 1.

8. The electronic device according to claim 7, wherein the processor is further configured to perform a method for training the magnetic particle reconstruction model RecNet, and the method for training the magnetic particle reconstruction model RecNet comprises:

A100: obtaining a to-be-reconstructed gray level image, and pre-processing the gray level image;

A200: performing MPI emulation on a pre-processed gray level image to obtain the 1D MPI signal and the velocity signal of the FFP;

A300: inputting the 1D MPI signal and the velocity signal of the FFP into a pre-constructed magnetic particle reconstruction model RecNet for image reconstruction to obtain the 2D MPI image, and taking the 2D MPI image as a reconstructed image;

A400: obtaining a loss value by using a mean square error (MSE) loss function based on the reconstructed image and the to-be-reconstructed gray level image corresponding to the 1D MPI signal and the velocity signal of the FFP that are input into the magnetic particle reconstruction model RecNet, and then performing back propagation to update a parameter of the magnetic particle reconstruction model RecNet; and A500: iterating the steps A100 to A400 until the trained magnetic particle reconstruction model RecNet is obtained.

9. The electronic device according to claim 8, wherein the pre-processing of the gray level image comprises:

performing interpolation processing on the gray level image to obtain an interpolated gray level image;

randomly clipping the interpolated gray level image, and placing a randomly clipped interpolated gray level image at a specified position of a first image to synthesize a new image, wherein the first image is an image whose pixel gray-level values are all 0 and whose size is the same as that of the interpolated gray level; and rotating the synthesized image by specified degrees, and taking a rotated image as the pre-processed gray level image, wherein the specified degrees are an integer multiple of 90 degrees.

10. The electronic device according to claim 8, wherein the performing of the MPI emulation on the pre-processed gray level image comprises:

linearly converting a pixel gray-level value of the pre-processed gray level image into a magnetic particle concentration signal; and performing the MPI emulation by using a Langevin equation based on the magnetic particle concentration signal and specified emulation parameters, to obtain the 1D MPI signal and the velocity signal of the FFP, wherein the emulation parameters comprise magnetic particle temperature, saturation magnetization, an amplitude and a frequency of the magnetic field intensity of the driving field, the magnetic field intensity of the selection field, a sampling frequency, repeated sampling time, coil sensitivity, and a field of view (FOV).

11. The electronic device according to claim 10, wherein the linearly converting of the pixel gray-level value of the pre-processed gray level image into the magnetic particle concentration signal is as follows:

$$c(r)=c_{max}g(r)/g_{max}$$

wherein $c(r)$ represents a concentration signal of a magnetic particle at a pixel point r of the pre-processed gray level image, $g(r)$ represents a pixel gray-level value at the pixel point r, and $c_{max}$ and $g_{max}$ respectively represent a specified maximum magnetic particle concentration and a specified maximum pixel gray-level value.

12. A computer-readable storage medium, wherein the computer-readable storage medium stores a computer instruction, and the computer instruction is executed by a computer to implement the MPI reconstruction method based on the RecNet model according to claim 1.

13. The computer-readable storage medium according to claim 12, wherein the computer instruction is further configured to cause the computer to implement a method for training the magnetic particle reconstruction model RecNet, and the method for training the magnetic particle reconstruction model RecNet comprises:

A100: obtaining a to-be-reconstructed gray level image, and pre-processing the gray level image;

A200: performing MPI emulation on a pre-processed gray level image to obtain the 1D MPI signal and the velocity signal of the FFP;

A300: inputting the 1D MPI signal and the velocity signal of the FFP into a pre-constructed magnetic particle reconstruction model RecNet for image reconstruction to obtain the 2D MPI image, and taking the 2D MPI image as a reconstructed image;

A400: obtaining a loss value by using a mean square error (MSE) loss function based on the reconstructed image and the to-be-reconstructed gray level image corresponding to the 1D MPI signal and the velocity signal of the FFP that are input into the magnetic particle reconstruction model RecNet, and then performing back propagation to update a parameter of the magnetic particle reconstruction model RecNet; and A500: iterating the steps A100 to A400 until the trained magnetic particle reconstruction model RecNet is obtained.

14. The computer-readable storage medium according to claim 13, wherein the pre-processing of the gray level image comprises:

performing interpolation processing on the gray level image to obtain an interpolated gray level image;

randomly clipping the interpolated gray level image, and placing a randomly clipped interpolated gray level image at a specified position of a first image to synthesize a new image, wherein the first image is an image whose pixel gray-level values are all 0 and whose size is the same as that of the interpolated gray level; and rotating the synthesized image by specified degrees, and taking a rotated image as the pre-processed gray level image, wherein the specified degrees are an integer multiple of 90 degrees.

15. The computer-readable storage medium according to claim 13, wherein the performing of the MPI emulation on the pre-processed gray level image comprises:

linearly converting a pixel gray-level value of the pre-processed gray level image into a magnetic particle concentration signal; and performing the MPI emulation by using a Langevin equation based on the magnetic particle concentration signal and specified emulation parameters, to obtain the 1D MPI signal and the velocity signal of the FFP, wherein the emulation parameters comprise magnetic particle temperature, saturation magnetization, an amplitude and a frequency of the magnetic field intensity of the driving field, the magnetic field intensity of the selection field, a sampling frequency, repeated sampling time, coil sensitivity, and a field of view (FOV).

16. The computer-readable storage medium according to claim 15, wherein the linearly converting of the pixel gray-level value of the pre-processed gray level image into the magnetic particle concentration signal is as follows:

$$c(r) = c_{max} g(r)/g_{max}$$

wherein $c(r)$ represents a concentration signal of a magnetic particle at a pixel point r of the pre-processed gray level image, $g(r)$ represents a pixel gray-level value at the pixel point r, and $c_{max}$ and $g_{max}$ respectively represent a specified maximum magnetic particle concentration and a specified maximum pixel gray-level value.

* * * * *